United States Patent
Yang et al.

(10) Patent No.: US 8,884,684 B2
(45) Date of Patent: Nov. 11, 2014

(54) CHARGE PUMP CIRCUITS HAVING FREQUENCY SYNCHRONIZATION WITH SWITCHING FREQUENCY OF POWER CONVERTERS

(71) Applicant: System General Corporation, New Taipei (TW)

(72) Inventors: Ta-Yung Yang, Milpitas, CA (US); Chou-Sheng Wang, Keelung (TW); Tse-Jen Tseng, Taichung (TW)

(73) Assignee: System General Corporation, New Taipei (TW)

( * ) Notice: Subject to any disclaimer, the term of this patent is extended or adjusted under 35 U.S.C. 154(b) by 0 days.

(21) Appl. No.: 14/025,969

(22) Filed: Sep. 13, 2013

(65) Prior Publication Data

US 2014/0118039 A1    May 1, 2014

Related U.S. Application Data

(60) Provisional application No. 61/719,584, filed on Oct. 29, 2012.

(51) Int. Cl.
*G05F 3/02* (2006.01)
*H03L 7/08* (2006.01)

(52) U.S. Cl.
CPC .......................... *H03L 7/08* (2013.01)
USPC ............................. 327/536; 327/157

(58) Field of Classification Search
None
See application file for complete search history.

(56) References Cited

U.S. PATENT DOCUMENTS

2010/0073082 A1*  3/2010  Takeshita et al. ............. 327/581

* cited by examiner

*Primary Examiner* — Cassandra Cox
(74) *Attorney, Agent, or Firm* — McClure, Qualey & Rodack, LLP

(57) ABSTRACT

A control circuit of a power converter is provided. The control circuit includes a switching circuit and a charge pump circuit. The switching circuit generates a switching signal for controlling the power converter. The charge pump circuit includes an oscillator for generating an oscillation signal synchronized with the switching signal. The oscillation signal is coupled to control a switch of the charge pump circuit for generating a voltage source.

12 Claims, 11 Drawing Sheets

CHARGE PUMP CIRCUITS HAVING FREQUENCY SYNCHRONIZATION WITH SWITCHING FREQUENCY OF POWER CONVERTERS

CROSS REFERENCE TO RELATED APPLICATIONS

This application claims the benefit of U.S. Provisional Application No. 61/719,584, filed on Oct. 29, 2012, the contents of which are incorporated herein by reference.

BACKGROUND OF THE INVENTION

1. Field of the Invention

The invention relates to a control circuit for a power converter and a method for generating a charge pump signal of a power converter.

2. Description of the Related Art

In general, frequency of a charge pump is not always to be synchronized with switching frequency of the power converter, especially, at the light load, which will cause noise problem and not fit the customer's requirement.

BRIEF SUMMARY OF THE INVENTION

The present invention provides frequency synchronization for the charge pump circuit and the power converter. The frequency of the charger pump circuit will be synchronized with the switching frequency of the power converter, which will achieve lower noise for the power converter.

An exemplary embodiment of a control circuit of a power converter is provided. The control circuit comprises a switching circuit and a charge pump circuit. The switching circuit generates a switching signal for controlling the power converter. The charge pump circuit comprises an oscillator for generating an oscillation signal synchronized with the switching signal. The oscillation signal is coupled to control a switch of the charge pump circuit for generating a voltage source.

A method for generating a charge pump signal of a power converter is provided. The method comprises the step of generating a synchronization signal in response to a switching signal of the power converter; generating an oscillation signal synchronized with the synchronization signal; and generating the charge pump signal in accordance with the oscillation signal. The charge pump signal is coupled to control a switch for generating a voltage source.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
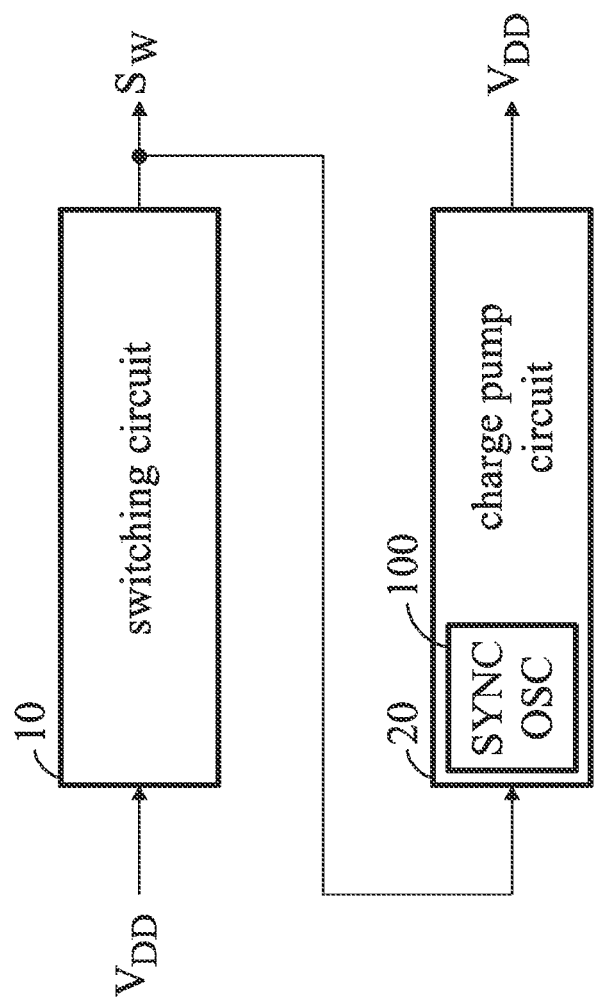
FIG. 1 shows an exemplary embodiment of a control circuit for a power converter.

FIG. 1 shows an exemplary embodiment of a control circuit for a power converter in accordance with the present invention. The control circuit comprises a switching circuit 10 and a charge pump circuit 20. The switching circuit 10 generates a switching signal $S_W$ for regulating the output of the power converter. The charge pump circuit 20 comprises a synchronous oscillator (SYNC SOC) 100 coupled to receive the switching signal $S_W$ for generating a power source $V_{DD}$. The power source $V_{DD}$ is further coupled to supply the power to the switching circuit 10. The switching circuit 10 can operate as a synchronous rectifying control circuit, and, thus, the switching signal $S_W$ serves as a synchronous rectifying signal.

Figure 2:
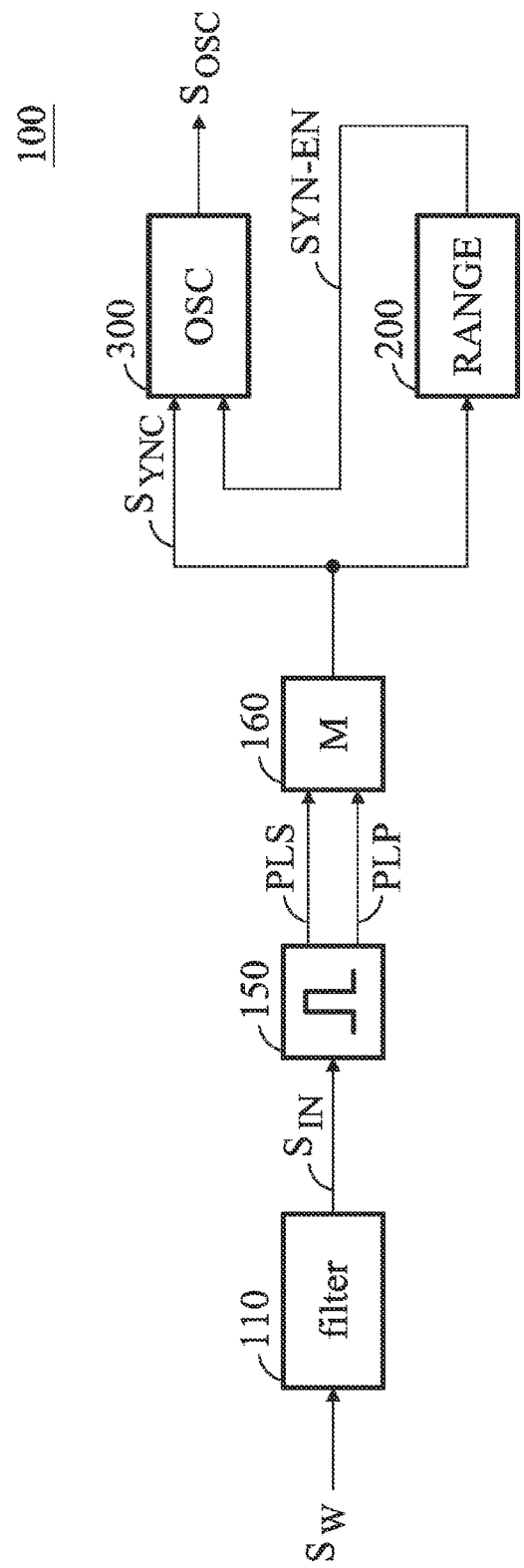
FIG. 2 is an exemplary embodiment of a synchronous oscillator of the control circuit in FIG. 1.

FIG. 2 is an exemplary embodiment of the synchronous oscillator 100 in accordance with the present invention. The synchronous oscillator 100 comprises a filter 110, a pulse generator 150, a frequency multiplier (M) 160, a range-detection circuit (RANGE) 200, and an oscillator (OSC) 300. The filter 110 is coupled to receive the switching signal $S_W$ and generate an input signal $S_{IN}$. The input signal $S_{IN}$ is coupled to the pulse generator 150 for generating a pulse signal PLS and a sample signal PLP. The frequency multiplier 160 generates a synchronization signal $S_{YNC}$ in response to the pulse signal PLS and the sample signal PLP. The synchronization signal $S_{YNC}$ has the frequency twice the frequency of the pulse signal PLS. The synchronization signal $S_{YNC}$ is further coupled to the range-detection circuit 200 to generate an enable signal SYN-EN if the frequency of the synchronization signal $S_{YNC}$ is within a range. The enable signal SYN-EN will be enabled if the period of the synchronization signal $S_{YNC}$ is longer than a minimum-period and shorter than a maximum-period. Once the enable signal SYN-EN is enabled, the oscillator 300 will generate an oscillation signal $S_{OSC}$ in accordance with the synchronization signal $S_{YNC}$, such that the oscillation signal $S_{OSC}$ is synchronized with the synchronization signal $S_{YNC}$. If the period of the synchronization signal $S_{YNC}$ is shorter than the minimum-period or longer that the maximum-period, the enable signal SYN-EN is disabled. Once the enable signal SYN-EN is disabled, the oscillator 300 will generate the oscillation signal $S_{OSC}$ without the synchronization (free run). The oscillation signal $S_{OSC}$ is utilized to switch the charge pump circuit 20. In the embodiment, the filter 110, the pulse generator 150, and the frequency multiplier 160 form a synchronization circuit for generating the synchronization signal $S_{YNC}$ is in response to the switching signal $S_W$. In an embodiment, the synchronization signal $S_{YNC}$ has a frequency multiplied in response to a frequency of the switching signal $S_W$.

Figure 3:
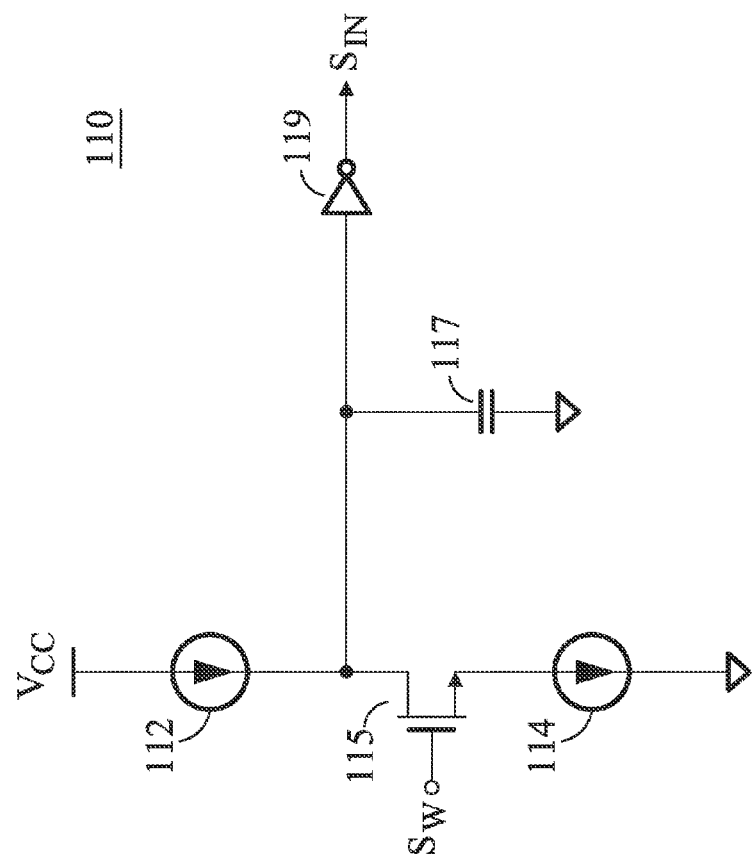
FIG. 3 shows an exemplary of a filter 110 of the synchronous oscillator in FIG. 2.

FIG. 3 shows an exemplary of the filter 110. The input signal $S_{IN}$ is generated in accordance with the switching signal $S_W$. Referring to FIG. 3, the filter 110 comprises current sources 112 and 114, a transistor 115, a capacitor 117, and a inverter 119. The current source 112 has a first terminal coupled to a voltage source $V_{CC}$ and a second terminal. The gate of the transistor 115 receives the switching signal $S_W$, and the drain thereof is coupled to the second terminal of the current source 112. The current source 114 has a first terminal coupled to the source of the transistor 115 and a second terminal coupled to the ground. The capacitor 117 has a first terminal coupled to the joint point of the current source 112 and the transistor 115 and a second terminal coupled to the ground. The input terminal of the inverter 119 is coupled to the joint point of the current source 112 and the transistor 115, and the output thereof generates the input signal $S_{IN}$. The current sources 112 and 114 associated with the capacitor 117 provide a low-pass filtering for generating the input signal $S_{IN}$.

Figure 4:
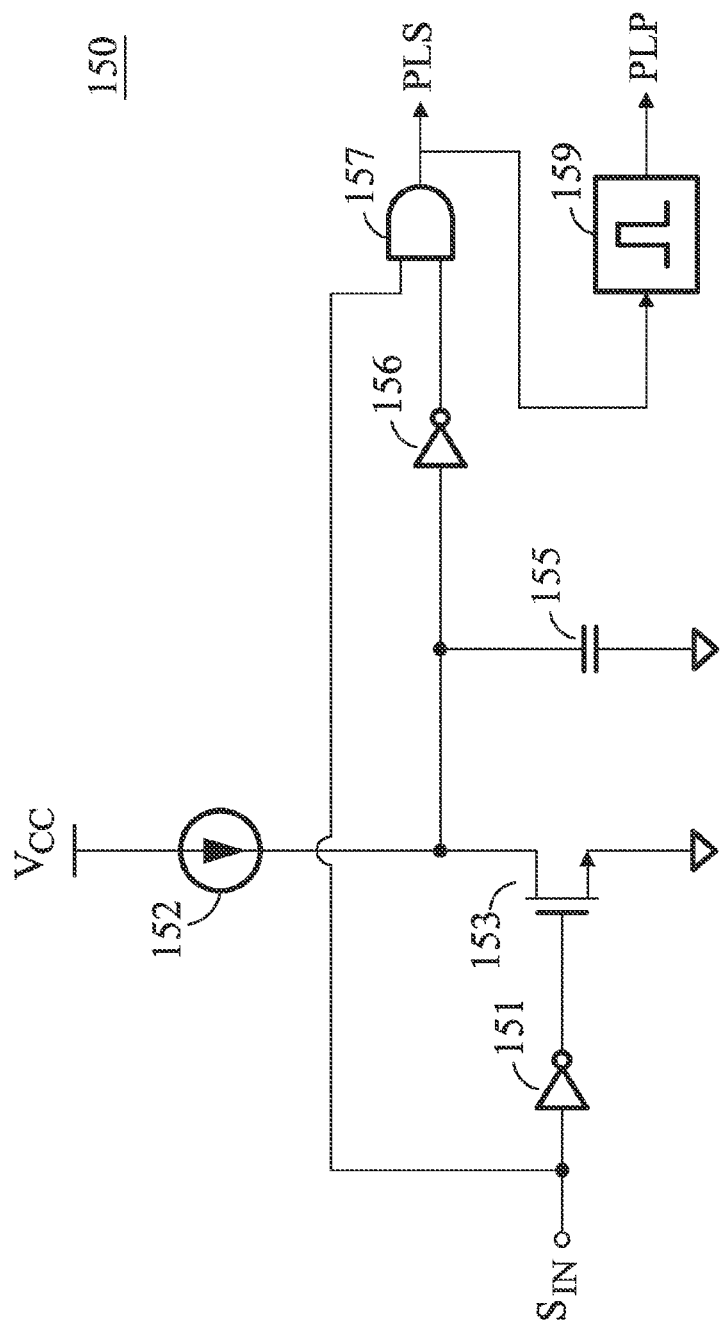
FIG. 4 shows an exemplary embodiment of a pulse generator 150 of the synchronous oscillator in FIG. 2.

FIG. 4 shows an exemplary embodiment of the pulse generator 150. The pulse signal PLS is generated in response to the rising edge for the input signal $S_{IN}$. The pulse generator 150 includes an inverter 151, a current source 152, a transistor 153, a capacitor 155, an inverter 156, an AND gate 157, and a pulse generation circuit 159. The current source 152 is coupled to charge the capacitor 155. The transistor 153 is coupled to discharge the capacitor 155. The input signal $S_{IN}$ is coupled to control the transistor 153 through the inverter 151. The input signal $S_{IN}$ is further coupled to an input of the AND gate 157. Another input of the AND gate 157 is coupled to the capacitor 155 via the inverter 156. The pulse signal PLS is generated at the output of the AND gate 157. The pulse width of the pulse signal PLS is determined by the current of the current source 152 and the capacitance of the capacitor 155. The pulse generation circuit 159 receives the pulse signal PLS. The pulse generation circuit 159 is further coupled to generate the sample signal PLP in response to the rising edge of the pulse signal PLS. The pulse width of the sample signal PLP is shorter than the pulse width of the pulse signal PLS.

Figure 5:
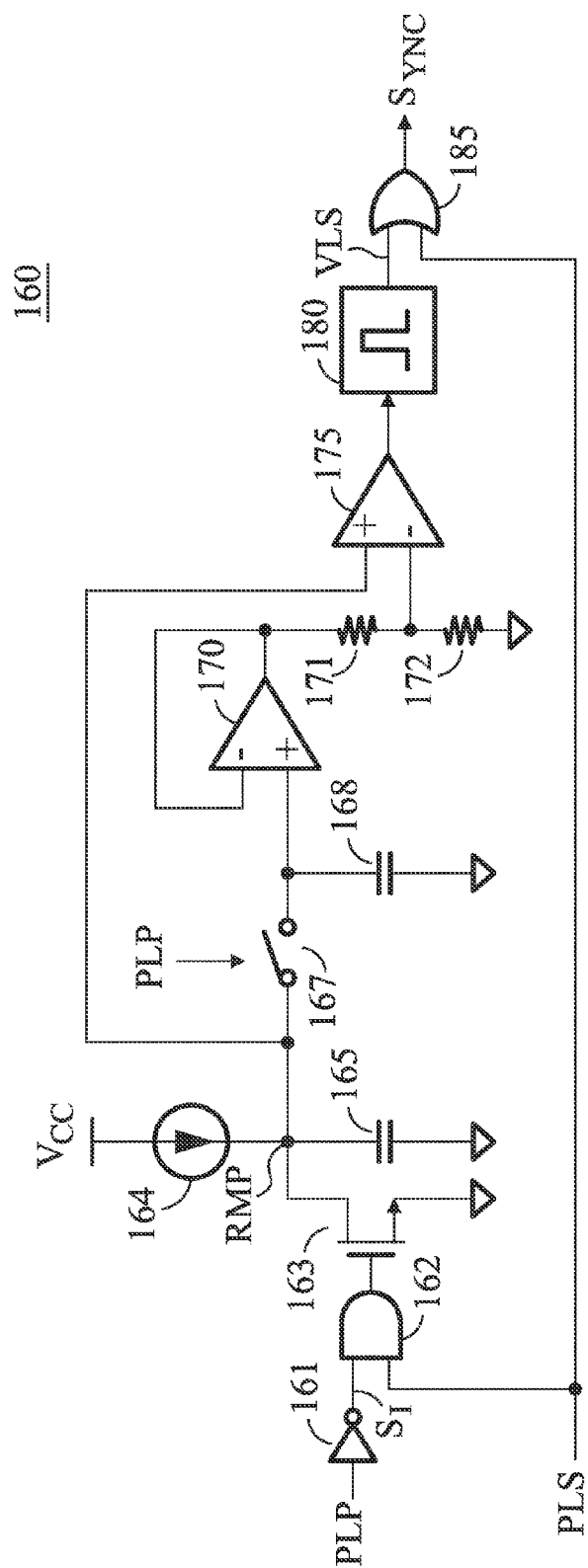
FIG. 5 shows an exemplary embodiment of a frequency multiplier 160 of the synchronous oscillator in FIG. 2.

FIG. 5 shows an exemplary embodiment of the frequency multiplier 160 in accordance to the present invention. An inverter 161 receives the sample signal PLP to generate an inverse signal $S_I$. The pulse signal PLS and the inverse signal of the sample signal PLP are coupled to discharge a capacitor 165 through an AND gate 162 and a transistor 163. A current source 164 associated with the capacitor 165 generate a ramp signal RMP in accordance with the period of the pulse signal PLS. The level (peak level) of the ramp signal RMP is sampled into a capacitor 168 through a switch 167. The sample signal PLP controls the switch 167. A unit-gain buffer amplifier 170 is coupled to the capacitor 168 to generate a divided signal via resistors 171 and 172. The divided signal is further coupled to a comparator 175 to compare with the ramp signal RMP for generating a phase-lock signal VLS through a pulse generator 180. The phase-lock signal VLS is thus generated between two pulses of the pulse signal PLS. The synchronization signal $S_{YNC}$ is generated by an OR gate 185 in accordance with the pulse signal PLS and the phase-lock signal VLS. The synchronization signal $S_{YNC}$ has the frequency twice frequency of the pulse signal PLS and the switching signal $S_W$.

Figure 6:
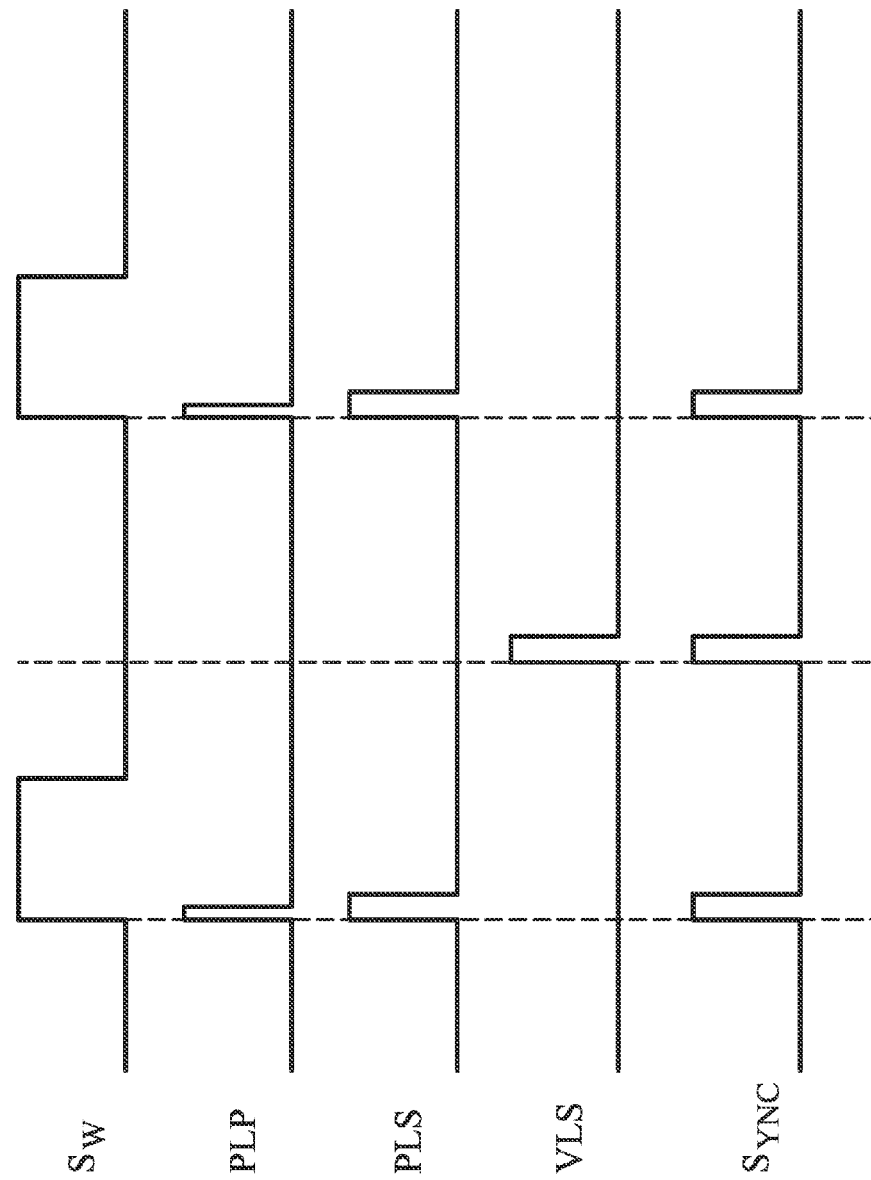
FIG. 6 shows waveforms of a sample signal, a pulse signal, a phase-lock signal, and a synchronization signal $S_{YNC}$ of the synchronous oscillator in FIG. 2.

FIG. 6 shows the waveforms of the sample signal PLP, the pulse signal PLS, the phase-lock signal VLS, and the synchronization signal $S_{YNC}$.

Figure 7:
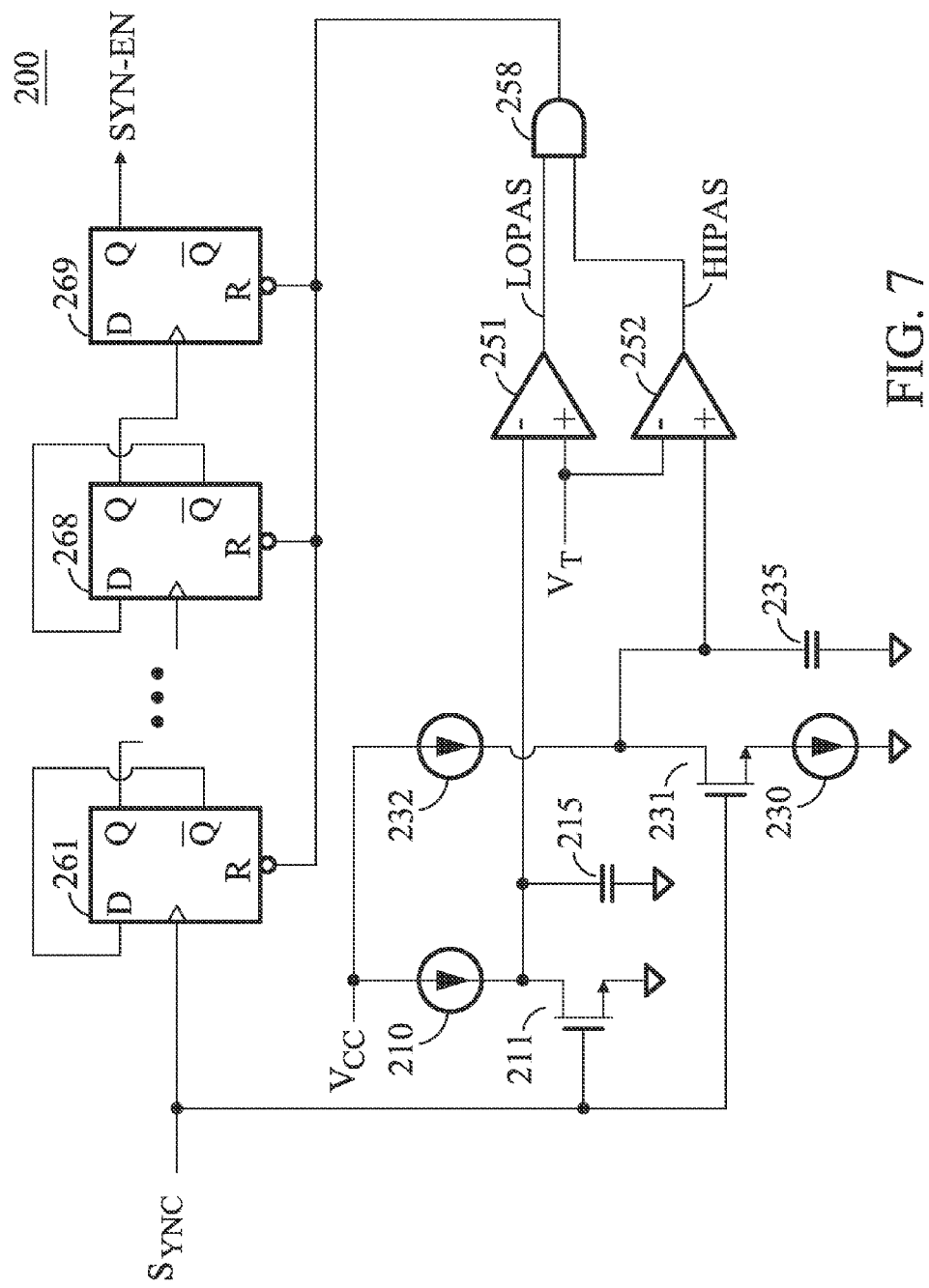
FIG. 7 shows an exemplary embodiment of a range-detection circuit of the synchronous oscillator in FIG. 2.

FIG. 7 shows an exemplary embodiment of the range-detection circuit 200 in accordance with the present invention. A current source 210 and a capacitor 215 determine a low-pass time constant. The current source 232 and a capacitor 235 determine a high-pass time constant. The synchronization signal $S_{YNC}$ is coupled to discharge the capacitor 215 via a transistor 211. A comparator 251 compares the voltage level of the capacitor 215 with a threshold voltage $V_T$ and generates a low-pass signal LOPAS if the voltage level of the capacitor 215 is higher than the threshold voltage $V_T$. The low-pass signal LOPAS will be coupled to reset a counter through an AND gate 258 if the period of the synchronization signal $S_{YNC}$ is longer than the low-pass time constant.

A current source 230 and a capacitor 235 determine a high-pass time constant. The synchronization signal $S_{YNC}$ is coupled to discharge the capacitor 235 via a transistor 231. A comparator 252 compares the voltage level of the capacitor 235 with the threshold voltage $V_T$ and generates a high-pass signal HIPAS if the voltage level of the capacitor 235 is lower than the threshold voltage $V_T$. The high-pass signal HIPAS will be coupled to reset the counter through the AND gate 258 if the period of the synchronization signal $S_{YNC}$ is shorter than the high-pass time constant. Flip-flops 261 and 268 develop the above counter. A flip-flop 269 operates as a latch. The synchronization signal $S_{YNC}$ clocks the counter and the flip-flop 269.

The counter will generate the enable signal SYN-EN if the frequency of the synchronization signal $S_{YNC}$ is within a specific range. It means the enable signal SYN-EN will be enabled if the period of the synchronization signal $S_{YNC}$ is longer than the minimum-period and shorter than the maximum-period. The low-pass time constant is related to the maximum-period. The high-pass time constant is related to the minimum-period. If the period of the synchronization signal $S_{YNC}$ is within the minimum-period and the maximum-period, the enable signal SYN-EN will be enabled after a delay. The delay is determined by a number of cycles of synchronization signal SYNC through the counter.

Figure 8:
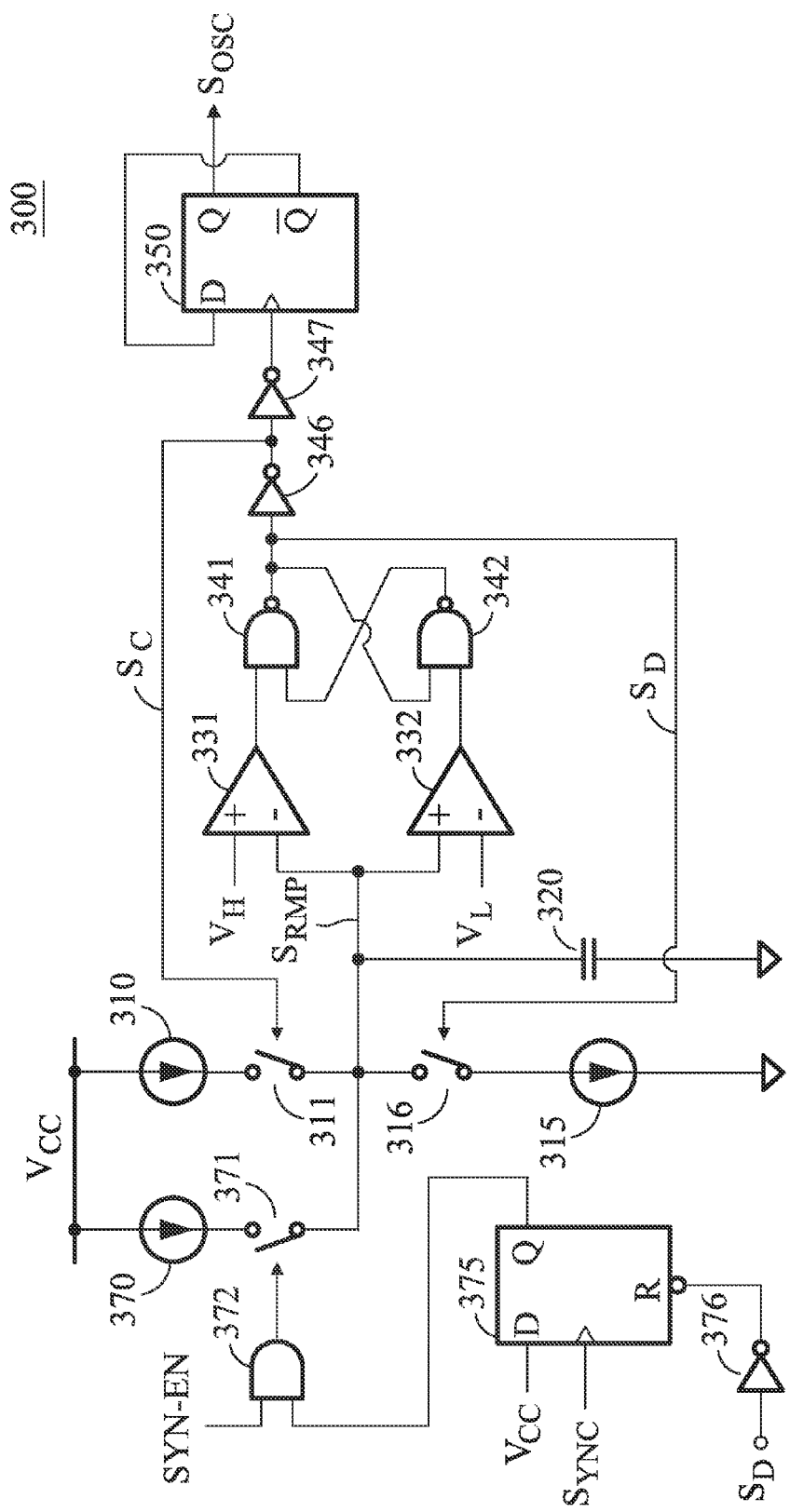
FIG. 8 shows an exemplary embodiment of an oscillator of the synchronous oscillator in FIG. 2.

FIG. 8 shows an exemplary embodiment of the oscillator 300 in accordance with the present invention. A current source 310 charges a capacitor 320 via a switch 311 for generating a ramp signal $S_{RMP}$. A current source 315 is coupled to discharge the capacitor 320 via a switch 316. Comparators 331 and 332 are coupled to receive the ramp signal $S_{RMP}$ for comparing with trip-point voltages VH and, VL, respectively. NAND gates 341 and, 342 form a latch circuit coupled to receive the outputs of the comparators 331 and 332 for generating a discharging signal $S_D$. An inverter 346 generates a charging signal $S_C$ in accordance with the discharging signal $S_D$. The charging signal $S_C$ is further coupled to generate the oscillation signal $S_{OSC}$ through an inverter 347 and a flip-flop 350. The charging signal $S_C$ is coupled to control the switch 311. The discharging signal $S_D$ is coupled to control the switch 316. The synchronization signal $S_{YNC}$ is coupled to turn on a flip-flop 375. Through an AND gate 372 and a switch 371, the output of the flip-flop 375 is further coupled to turn on a current source 370 for speeding up the charge time of the capacitor 320 if the enable signal SYN-EN is enabled. The discharging signal $S_D$ is coupled to reset the flip-flop 375 via an inverter 376. Because the discharging signal $S_D$ is utilized to initiate the next cycle of the ramp signal $S_{RMP}$, the fast charging will be continued until the synchronization is made. Therefore, the ramp signal $S_{RMP}$ will be synchronized with the synchronization signal $S_{YNC}$ if the enable signal SYN-EN is enabled.

Figure 9:
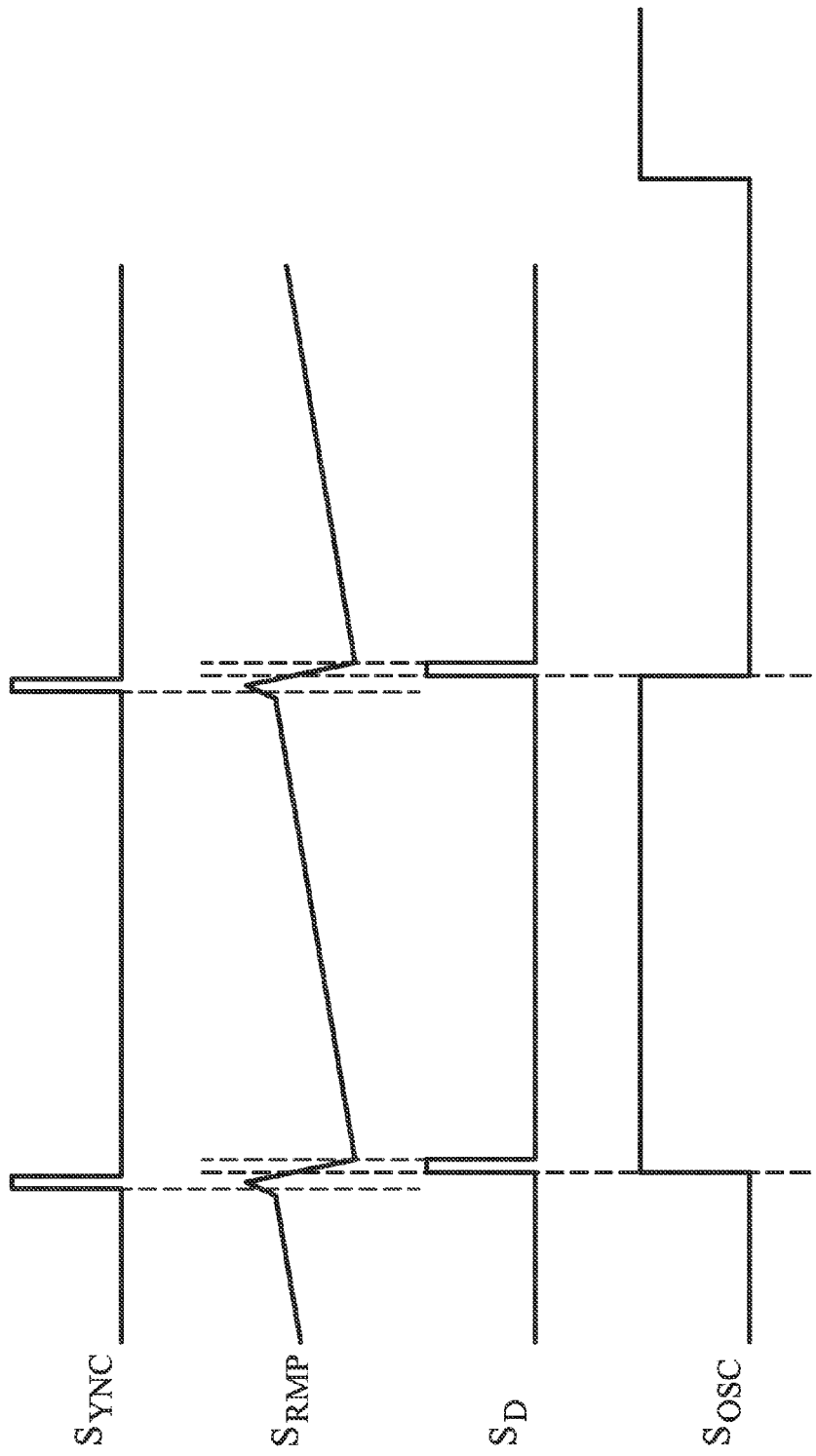
FIG. 9 is a schematic view showing synchronization for waveforms of a synchronization signal, a ramp signal, a discharging signal, and an oscillation signal of the synchronous oscillator in FIG. 2.

FIG. 9 shows the synchronization for the waveforms of the synchronization signal $S_{YNC}$, the ramp signal $S_{RMP}$, the discharging signal $S_D$, and the oscillation signal $S_{OSC}$.

Figure 10:
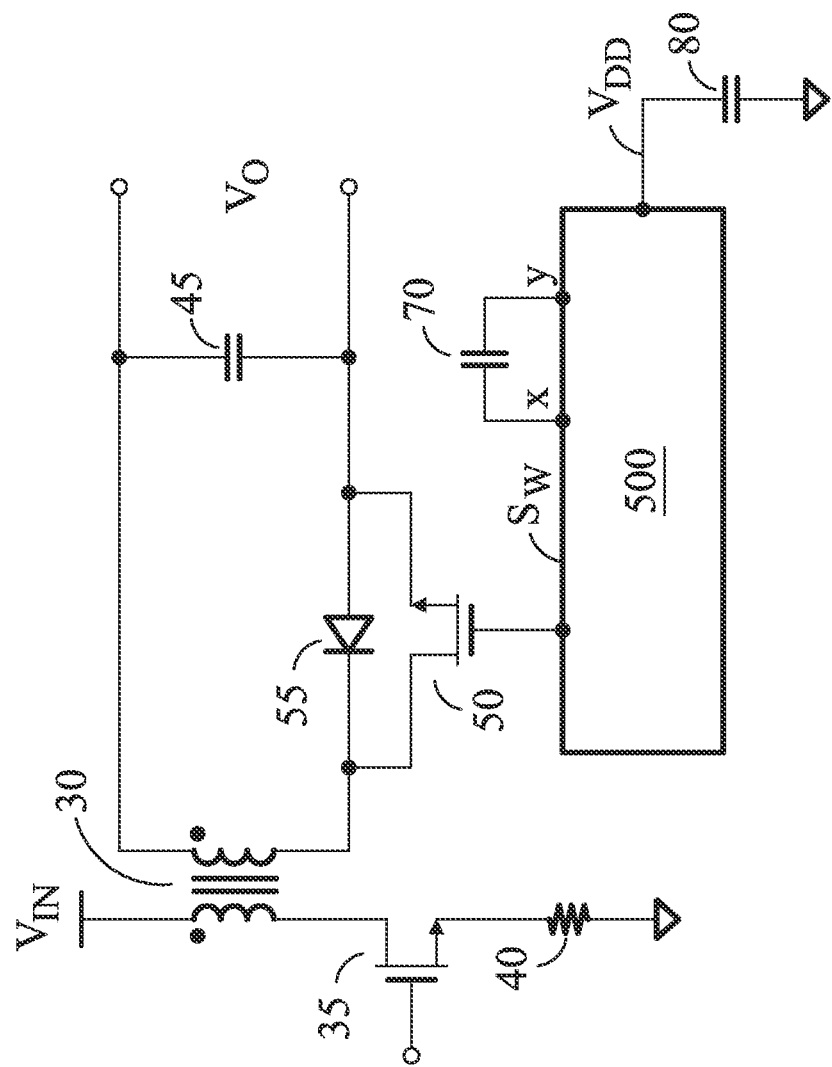
FIG. 10 shows an exemplary embodiment of a power converter to the present invention.

FIG. 10 shows an exemplary embodiment of a power converter to the present invention. The power converter comprises a transformer 30, a transistor 35, a resistor 40, a capacitor 45, a metal oxide semiconductor field effect transistor (MOSFET) 50, a diode 55, a charge-pump capacitor 70, and a capacitor 80. The transformer 30 receives an input voltage $V_{IN}$. The transistor 35 is used to switch the transformer 30 for regulating an output voltage $V_O$ across the capacitor 45. A synchronous rectifying controller 500 generates the switching signal $S_W$ by a switching circuit to serve as a control signal for controlling the MOSFET 50 operated as a synchronous rectifier (SR). The synchronous rectifying controller 500 comprises the charge pump circuit to switch the charge-pump capacitor 70 for pumping the voltage source $V_{DD}$ on the capacitor 80.

Figure 11:
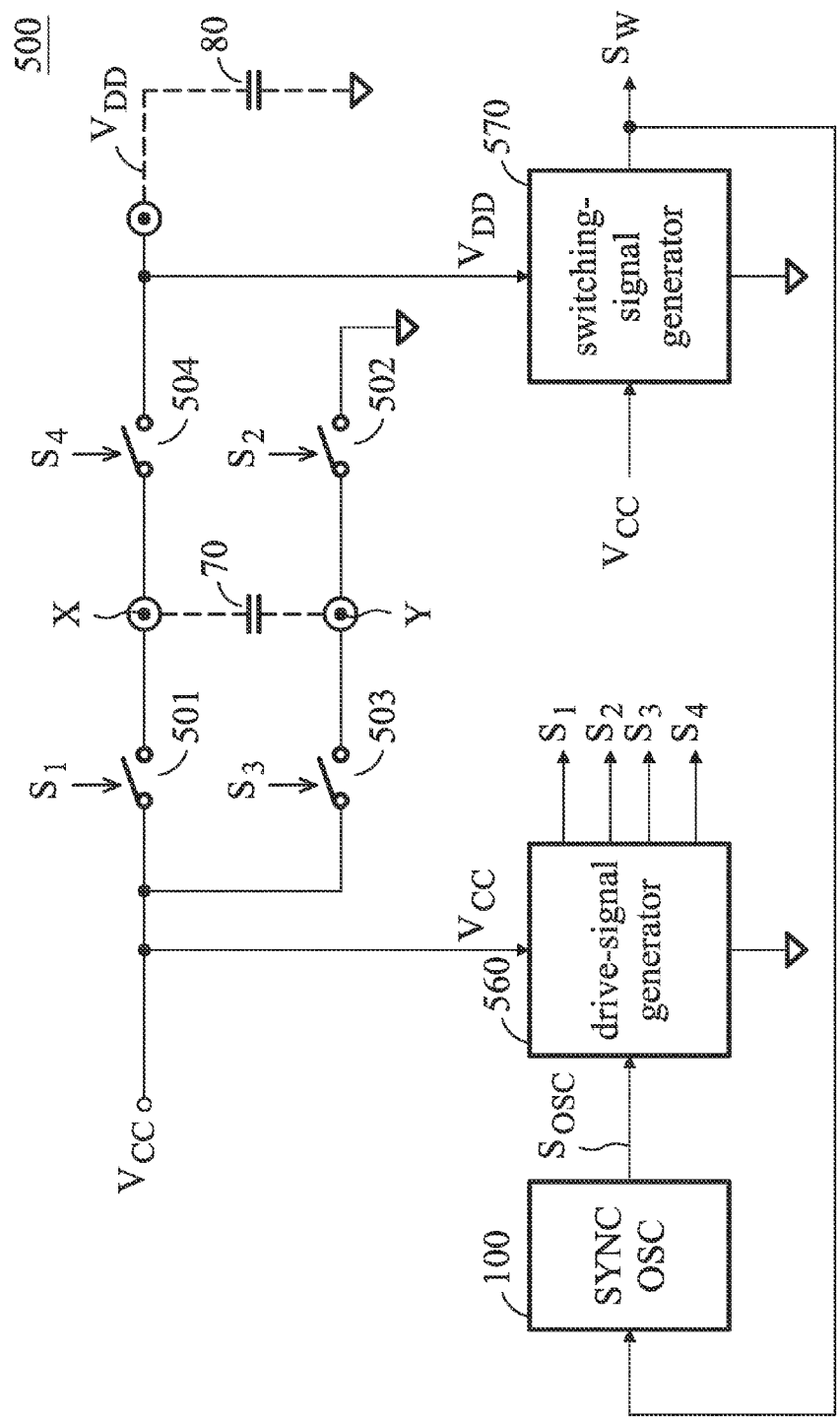
FIG. 11 shows an exemplary embodiment of the synchronous rectifying circuit.

FIG. 11 shows an exemplary embodiment of the synchronous rectifying controller 500 according to the present invention. The synchronous rectifying controller 500 includes a switching-signal generator 570 to generate the switching signal $S_W$ for the synchronous rectifying. The synchronous oscillator 100 generates the oscillation signal $S_{OSC}$ in response to the switching signal $S_W$. The oscillation signal $S_{OSC}$ is coupled to a drive-signal generator 560 to generate drive signals (also referred to as charge pump signals) $S_1$, $S_2$, $S_3$, and $S_4$. The drive signals $S_1$, $S_2$, $S_3$, and $S_4$ are coupled to control switches 501, 502, 503, and 504 respectively for switching the charge-pump capacitor 70 and generating the voltage source $V_{DD}$ on the capacitor 80. The frequency of the oscillation signal $S_{OSC}$ and the switching frequency of the drive signals $S_1$, $S_2$, $S_3$, and $S_4$ are synchronized with the frequency of the switching signal $S_W$.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A control circuit of a power converter, comprising:
   a switching circuit generating a switching signal for controlling the power converter; and
   a charge pump circuit comprising an oscillator for generating an oscillation signal synchronized with the switching signal;
   wherein the oscillation signal is coupled to control a switch of the charge pump circuit for generating a voltage source.

2. The control circuit as claimed in claim 1, wherein the switching circuit is a synchronous rectifying control circuit.

3. The control circuit as claimed in claim 1, wherein the switching signal is a control signal of a synchronous rectifier.

4. The control circuit as claimed in claim 1, wherein the oscillator comprising:
   a synchronization circuit generating a synchronization signal in response to the switching signal; and
   a range-detection circuit generating an enable signal to enable synchronization;
   wherein the oscillation signal will be synchronized with the synchronization signal after a delay if a frequency of the synchronization signal is within a frequency range.

5. The control circuit as claimed in claim 4, wherein the enable signal is enabled once a period of the synchronization signal is longer than a minimum period and shorter than a maximum period.

6. The control circuit as claimed in claim 5, wherein the synchronization circuit comprises a frequency multiplier.

7. A method for generating a charge pump signal of a power converter, comprising:
   generating a synchronization signal in response to a switching signal of the power converter;
   generating an oscillation signal synchronized with the synchronization signal; and
   generating the charge pump signal in accordance with the oscillation signal;
   wherein the charge pump signal is coupled to control a switch for generating a voltage source.

8. The method as claimed in claim 7, wherein the switching signal is a synchronous rectifying signal.

9. The method as claimed in claim 7, wherein the oscillation signal is synchronized with the synchronization signal if a frequency of the synchronization signal is within a frequency range.

10. The method as claimed in claim 7, wherein the oscillation signal is synchronized with the synchronization signal once a period of the synchronization signal is longer than a minimum period and shorter than a maximum period.

11. The method as claimed in claim 7, wherein the oscillation signal is free running if the period of the synchronization signal is shorter than a minimum period or longer than a maximum period.

12. The method as claimed in claim 7, wherein the synchronization signal has a frequency multiplied in response to a frequency of the switching signal of the power converter.

* * * * *